United States Patent [19]

Shiba

[11] 4,074,304
[45] Feb. 14, 1978

[54] SEMICONDUCTOR DEVICE HAVING A MINIATURE JUNCTION AREA AND PROCESS FOR FABRICATING SAME

[75] Inventor: Hiroshi Shiba, Tokyo, Japan

[73] Assignee: Nippon Electric Company, Ltd., Tokyo, Japan

[21] Appl. No.: 773,658

[22] Filed: Mar. 2, 1977

Related U.S. Application Data

[63] Continuation of Ser. No. 618,419, Oct. 1, 1975, abandoned.

[30] Foreign Application Priority Data

Oct. 4, 1974   Japan ................................. 49-114408

[51] Int. Cl.$^2$ ..................... H01L 29/04; H01L 27/02; H01L 29/34; H01L 23/48
[52] U.S. Cl. ........................................ 357/59; 357/40; 357/49; 357/54; 357/65; 357/68; 148/175; 148/187; 148/189; 29/625
[58] Field of Search ................... 357/40, 49, 50, 23, 357/59, 65, 54, 68; 148/187, 175, 189; 29/625

[56] References Cited

U.S. PATENT DOCUMENTS

| | | | |
|---|---|---|---|
| 3,456,335 | 7/1969 | Hennings et al. | 357/49 |
| 3,664,896 | 5/1972 | Duncan | 357/59 |
| 3,717,514 | 2/1973 | Burgess | 357/65 |
| 3,761,327 | 9/1973 | Harlow | 357/23 |
| 3,791,024 | 2/1974 | Boleky | 357/49 |
| 3,796,613 | 3/1974 | Magdo et al. | 357/49 |
| 3,806,361 | 4/1974 | Lehner | 357/65 |
| 3,847,687 | 11/1974 | Davidsohn | 357/65 |
| 3,947,299 | 3/1976 | Weijland | 357/50 |

OTHER PUBLICATIONS

Quadratpilze aus Polysilicon, No. 3, vol. 15, Jan. 1974.

Primary Examiner—Andrew J. James
Attorney, Agent, or Firm—Hopgood, Calimafde, Kalil, Blaustein & Lieberman

[57] ABSTRACT

In a method for fabricating a semiconductor device, a polycrystalline film deposited on a main surface of a substrate is subjected to selective oxidation to form polycrystalline silicon electrode wiring paths separated by silicon oxide. An impurity of a conductivity type opposite to that of the substrate is introduced through at least one of the wiring paths into the substrate. Also disclosed is a novel semiconductor device fabricated according to this process which has a reduced junction area and a shortened junction-to-electrode distance.

9 Claims, 28 Drawing Figures

SEMICONDUCTOR DEVICE HAVING A MINIATURE JUNCTION AREA AND PROCESS FOR FABRICATING SAME

This is a continuation of Ser. No. 618,419, filed Oct. 1, 1975, which is now abandoned.

BACKGROUND OF THE INVENTION

1. Field of the Invention

This invention relates to a semiconductor device and a process for fabricating same, and more particularly to a structure of a super-miniature semiconductor device and a process for fabricating same.

2. Description of the Prior Art

With the prior art technology to improve the high-frequency performances of a semiconductor device, attempts have been directed to reduce the junction areas in the semiconductor device for reducing a parasitic capacity and to shorten the distances between p-n junctions and electrodes for reducing a parasitic resistance. However, such attempts have reached a limit, because there should be provided a certain distance between patterns for aligning the relative positions of the patterns, in addition to a minimum spacing which is determined by the working accuracy of the respective patterns, so that both the junction area and the junction-to-electrode distance inevitably exceed the minimum values determined by the working accuracy.

SUMMARY OF THE INVENTION

It is an object of the present invention to provide a novel structure which enables a miniature junction area and a shortened junction-to-electrode distance of a semiconductor device.

It is another object of the present invention to provide a novel method of readily and reliably producing a super-miniature semiconductor device having a miniature junction area.

The feature of the present invention lies in that a silicon film is deposited so as to make contact with a portion of a semiconductor substrate and subjected to selective oxidation to form electrode wiring paths isolated from each other by silicon oxide, and then an impurity of a conductivity type opposite to that of the substrate is introduced through at least one of the electrode wiring paths into the semiconductor substrate.

According to one aspect of the present invention, there is provided a semiconductor device comprising a semiconductor substrate having a first semiconductor region of one conductivity type and a second semiconductor region of the opposite conductivity type contained in the first semiconductor region with a p-n junction between the two regions, an insulating film coated on one main surface of the substrate and having an opening which exposes portions of the surface of the first semiconductor region and of the surface of the second semiconductor region, silicon oxide film obtained by selectively oxidizing a silicon film covering the insulating film and the exposed surface of the first and second semiconductor regions, said silicon oxide film covering a portion of said p-n junction exposed in the opening of the insulating film, and electrode wiring paths formed of the silicon film and mutually separated by the aforesaid silicon oxide film and making ohmic contacts with the first and the second semiconductor regions, respectively.

According to another aspect of the present invention, there is provided a method of producing the semiconductor device according to a principle incorporated in the firstly referred aspect of the present invention.

These and other objects and features of the present invention will be apparent from a reading of the ensuing part of the specification in conjunction with the accompanying drawings.

DESCRIPTION OF THE PREFERRED EMBODIMENTS

Figure 1A:
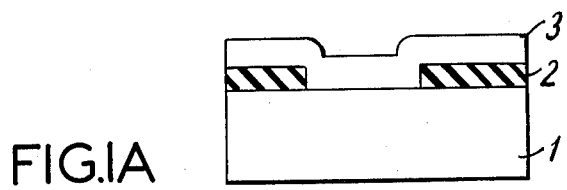
FIGS. 1A and 1B are the cross-sectional views showing respective steps of a process for illustrating a principle of the present invention.
Figure 1B:
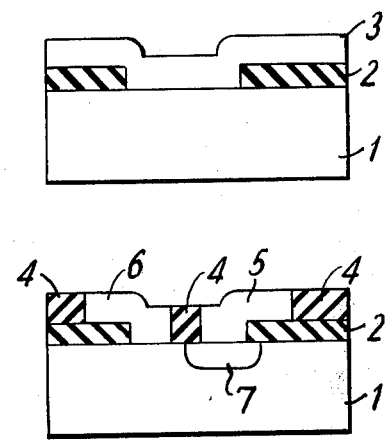

To begin with, the principle of the present invention will be described by referring to FIGS. 1A and 1B. As shown in FIG. 1A, a semiconductor substrate of one conductivity type is prepared, of which surface is covered with an oxide film 2 having an opening exposing a portion of the surface of the substrate 1, and a polycrystalline silicon film 3 is deposited over the surface of the oxide film 2 and the exposed surface of the substrate 1. Then, as shown in FIG. 1B, the polycrystalline silicon film is subjected to a selective oxidation treatment to convert a portion 4 thereof into silicon oxide and to form electrode wiring paths 5 and 6 separated and isolated by this silicon oxide 4. Thereafter, atoms of an impurity of the opposite conductivity type are introduced through a predetermined electrode wiring path 5 into the semiconductor substrate 1, thereby forming a P-N junction 7, as shown also in FIG. 1B. As a result, the P-N junction 7 and electrode wirings 5 and 6 for the N and P regions are arranged in such relative positions that minimum distances are automatically maintained between the respective two of the aforesaid three components 5, 6 and 7. This permits fabrication of an extremely minute semiconductor device.

Description will now be given in more detail of one embodiment of the invention in conjunction with FIGS. 2A to 2J, in which there is shown a process for fabricating a bi-polar transistor according to the present invention.

Figure 2A:
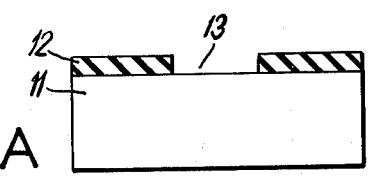
FIGS. 2A to 2J are cross-sectional views showing respective steps of the process according to one embodiment of the present invention.
Figure 2F:
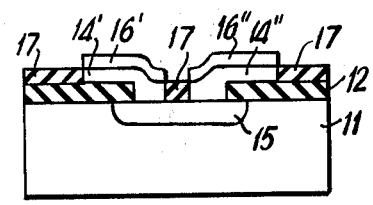
Figure 2B:
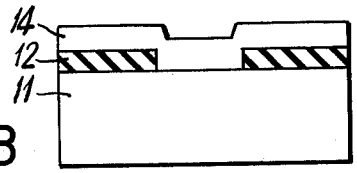
Figure 2G:
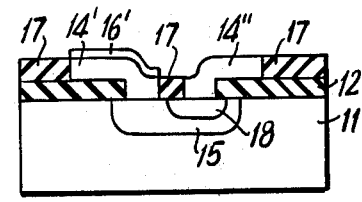
Figure 2C:
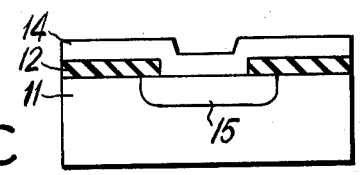
Figure 2H:
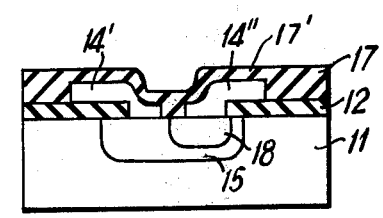
Figure 2D:
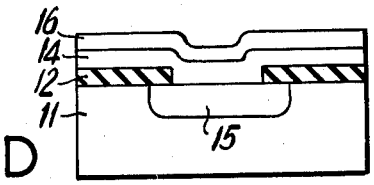
Figure 2I:
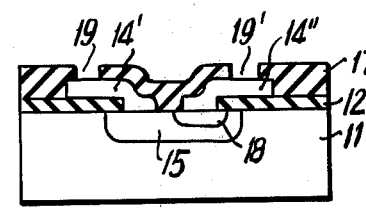
Figure 2E:
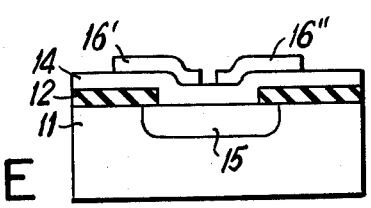
Figure 2J:
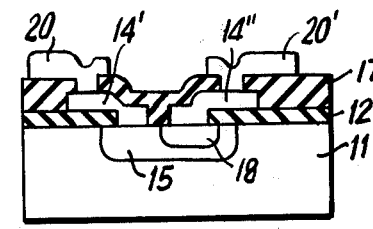

A silicon oxide film 12 is formed by thermally oxidizing an N type silicon substrate 11, an opening 13 is opened in a desired position of the silicon oxide film 12 to an extent reaching the surface of the substrate (FIG. 2A). Then, a thin silicon film 14 having a thickness of 0.5 micron is deposited according to the chemical vapor deposition technique on the substrate including the silicon oxide film 12 and the exposed surface of the substrate (FIG. 2B). Then, boron atoms are introduced through the thin silicon film 14 into the semiconductor substrate 11 according to the thermal diffusion process. In this process, the silicon oxide film 12 serves as a mask for boron atoms, so that boron atoms are introduced into the entire silicon film 14 and, through this silicon film 14, into a portion of the semiconductor substrate 11 under and near the opening 13 of the oxide film 12, and thus a P-type base region 15 is formed (FIG. 2C). Then, a silicon nitride film 16 is formed to a thickness of 0.2 micron on the surface of the thin silicon film 14 according to the chemical vapor deposition (FIG. 2D), after which a portion of the silicon nitride film 16 other than portions 16' and 16" for prospective electrode wiring paths are removed by using photoresist (FIG. 2E). It is recommended to use a plasma reaction of freon gas for selectively removing the silicon nitride film. Then, that portion of the silicon film 14, which is not covered with the silicon nitride films 16' and 16" is converted into silicon oxide 17 according to the thermal oxidation treatment. At this time, those portions 14' and 14" of the silicon film 14, which are covered with silicon nitride films 16' and 16", are not subjected to oxidation and hence remain as the silicon thin films intact, to form the electrode wiring paths 14' and 14" (FIG. 2F). Then, only one silicon nitride film 16" covering the thin silicon film 14" which corresponds to an emitter electrode wiring path, is selectively removed, and then phosphorous atoms are introduced according to the thermal diffusion process. At this time, the silicon oxide films 12, 17 and the silicon nitride film 16' serve as masks for phosphrous atoms, so that the phosphorous atoms are introduced in the silicon film portion 14" free of the silicon nitride film and in that region of the semiconductor substrate 11 which is in contact with the abovementioned silicon film portion 14". Thus, there is obtained an N-type emitter region 18 which has been converted from P-type of the base region 15, and an emitter electrode wiring path 14" which is brought into an ohmic connection with the emitter region 18 (FIG. 2G). Then, the remaining silicon nitride film is all removed, and the silicon oxide film 17' is formed on the thin silicon films 14' and 14" according to the oxidation treatment (FIG. 2H), after which openings 19 and 19' are prepared in the desired portions of the silicon oxide film 17' to partially expose the surface of the wiring paths 14' and 14" (FIG. 2I) and metal electrodes 20 and 20' are provided for external connection of the wiring paths 14' and 14", respectively, through the openings 19 and 19' (FIG. 2J), thus completing the fabrication of a bi-polar type NPN transistor. Meanwhile, as an alternative to the processes shown in FIGS. 2B and 2C, before the thin silicon film 14 is deposited, a base region 15 may be formed according to the diffusion or ion-implantation, after which the thin silicon film 14 doped with P-type impurities may be deposited thereon.

Description will be given of another preferred embodiment of the invention in conjunction with FIGS. 3A to 3H, in which the present invention is applied to a MOS type transistor.

Figure 3A:
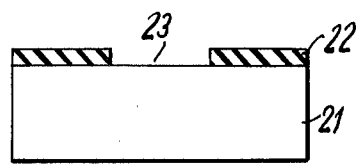
FIGS. 3A to 3H are cross sectional views showing respective steps of the process according to another embodiment of the invention, while FIG. E' is a plane view corresponding to FIG. 3E, FIG. 3E being a cross-sectional view taken along the line E—E of FIG. 3E'.
Figure 3B:
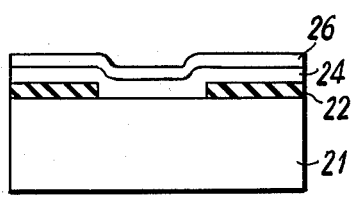
Figure 3C:
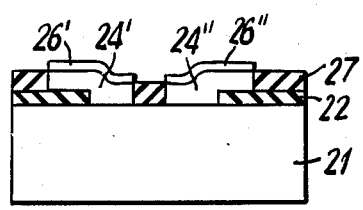
Figure 3D:
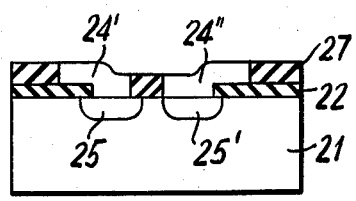
Figure 3E:
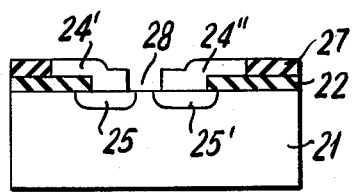
Figure 3F:
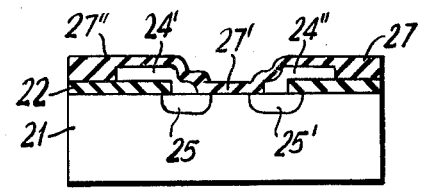
Figure 3G:
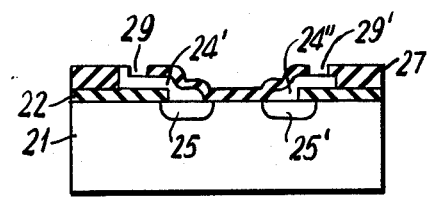
Figure 3H:
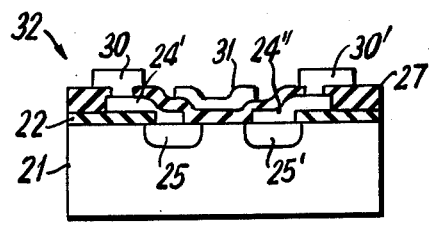
Figure 3E:
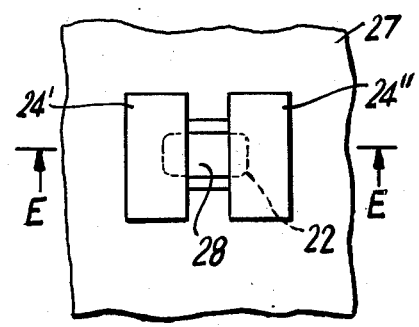

An opening 23 is formed in a predetermined portion of a thermally oxidized film 22 of an N-type semiconductor substrate 21 (FIG. 3A). Then, a thin silicon film 24 having a thickness of 0.5 micron and a silicon nitride film 26 having a thickness of 0.2 micron are sequentially deposited thereon according to the vapor deposition tequnique (FIG. 3B). Then, a portion of the silicon nitride film 26 other than portions 26' and 26" corresponding to electrode wiring paths to be prepared, is removed, and then thermal oxidation is carried out to selectively convert a portion of the thin silicon film 24 not covered with silicon nitride films 26' and 26" into silicon oxide 27, with a result that there are obtained two electrode wiring paths 24' and 24" of silicon separated from each other by silicon oxide 27 (FIG. 3C). Then, the remaining silicon nitride films are completely removed, after which boron atoms are introduced according to thermal diffusion process. In this process, boron atoms are introduced only into the electrode wiring paths 24' and 24" consisting of silicon films as well as into the semiconductor regions 25 and 25' of the semiconductor substrate 21 contacting with the electrode wiring paths 24' and 24", due to the masking actions of the silicon oxide 27 and silicon oxide film 22. As a result, P type source and drain regions 25 and 25' are formed (FIG. 3D). Then, that portion of the silicon oxide film 27, which is confined by the electrode wiring paths 24' and 24", is selectively removed so as to provide an opening 28, through which is exposed the semiconductor substrate (FIGS. 3E and 3E'). Thereafter, silicon oxide film 27' of a desired thickness is formed by means of thermal oxidation of that opening portion 28 of the surface of the substrate. At this time, the electrode wiring paths 24' and 24" consisting of silicon thin films are also subjected to the thermal oxidation, thereby forming a silicon oxide coating 27" (FIG. 3F). Then, openings 29 and 29' are prepared in the silicon oxide coating 27" to partially expose the electrode wiring paths 24' and 24", respectively (FIG. 3G). Then, there are prepared metal electrodes 30 and 30' for external connection of the wiring paths 24' and 24" through the openings 29 and 29', respectively, as well as a gate electrode 31 on the oxide film 27' (FIG. 3H), thus completing a P-channel MOS type transistor 32. A single MOS type transistor 32 alone is shown in the drawing in this embodiment. However, a plurality of transistors 32 of the same structure as that shown in FIG. 3H may be formed on the same semiconductor substrate 21 to give an MOS type integrated circuit. In this case, the electrode wiring paths 24' and 24" may be used as wirings in the first layer, while the electrodes 30 and 30' may be used as those in the second layer. Or, the electrodes 30 and 30' may only be used as wirings between elements which may possibly cause a parasitic MOS effect, while the oxide film 27 and the silicon oxide film 22 laid thereunder may be used as so-called field oxide.

Description will be given of still another preferred embodiment of the invension in conjunction with FIGS. 4A to 4F, in which the present invention is applied to a bi-polar type transistor in an integrated circuit.

Figure 4A:
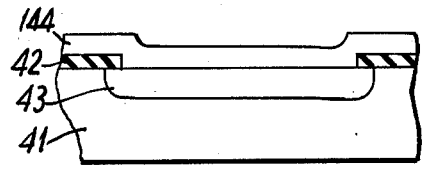
FIGS. 4A to 4F are cross-sectional views showing respective steps of the process according to still another embodiment of the invention.
Figure 4B:
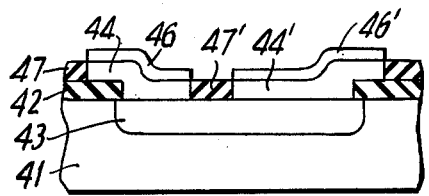
Figure 4C:
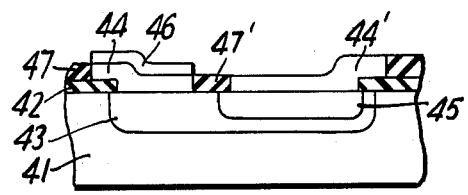
Figure 4D:
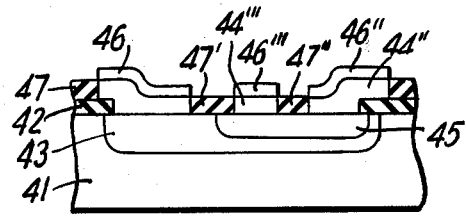
Figure 4E:
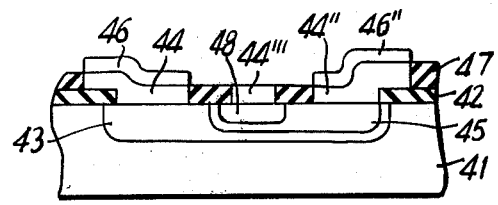
Figure 4E:
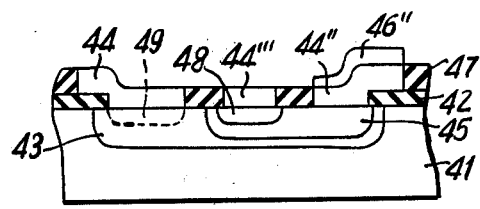
Figure 4F:
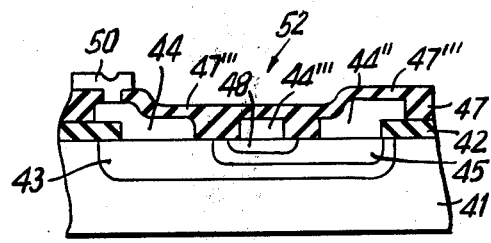

Firstly, an N type collector region 43 is formed within a P type semiconductor substrate 41 covered with an oxide film 42 having an opening, and then thin silicon film 144 is deposited on the surface of the substrate. The thin silicon film 144 thus contacts the collector region 43 through the opening defined in the oxide film 42 (FIG. 4A). For obtaining the structure of FIG. 4A, similar processes to those shown in FIGS. 2A to 3C may be followed. In other words, the silicon film 144 is prepared beforehand, and then an N-type impurity may be introduced into the substrate 41 through the silicon film 144, which contacts the surface of the substrate through the opening defined in the oxide film 42, thereby providing the collector region 43. Alternatively, an N-type impurity may be introduced through the opening in the oxide film 42 into the substrate 41 by means of diffusion or ion-implantation to provide the collector 43, and then the thin silicon film 144 doped with an N-type impurity or free of impurities may be deposited on the main surface of the substrate 41. Then, the thin silicon film 144 except for a portion to be converted into an insulating region 47' isolating a collector electrode wiring path from other electrode wiring paths is covered with silicon nitride films 46, 46', and then the uncovered portion of the thin silicon film 144 are converted into silicon oxide films 47 and 47' by thermal oxidation or anodic oxidation with the silicon nitride films 46 and 46' used as masks (FIG. 4B). Although the portion 47 outside the periphery of a transistor element is oxidized in this case, this portion 47 may be covered with the silicon nitride films 46, 46' in this step and may be exposed and oxidized in the second oxidizing step shown in FIG. 4D. According to this embodiment, there is formed a collector electrode wiring path 44 which is insulated from the other electrode wiring path 44', by means of the first oxidation step as shown in FIG. 4B. Then, the silicon nitride film 46' is removed, while leaving alone the silicon nitride film 46 which covers the surface of the collector electrode wiring path 44. Then, P-type impurity is introduced through the exposed electrode wiring path 44' into the collector region 43 to form a P-type base region 45 (FIG. 4C). Then, silicon nitride films 46" and 46''' are formed so as to expose at least such portion of the partially oxidized silicon film 44' that is to be converted into an insulating region 47" isolating a base electrode wiring path from an emitter electrode wiring path and to cover at least the base and emitter electrode wiring paths 44" and 44'''. Then, the partially exposed silicon film 44' is subjected to the second oxidizing treatment to the entire thickness thereof, thus converting same into silicon oxide 47" (FIG. 4D). As a result, there are formed base and emitter wiring paths 44" and 44'''. Then, the surface of the emitter wiring path 44''' is exposed, and an N type impurity is introduced through the emitter wiring path 44''' into the base region 45 to form an N type emitter region 48 (FIG. 4E). In case the silicon film (144 in FIG. 4A) formed initially has not been added with any impurity, or in case better collector contact with a metal electrode is desired, not only the surface of the emitter wiring path 44''' but also the surface of the collector wiring path 44 are exposed, and then N type impurities are introduced through the paths 44''' and 44, thereby forming an N+ type region 49 within the collector region 43, simultaneously with the formation of the emitter region 48 (FIG. 4E'). Then, the respective electrode wiring paths 44, 44" and 44''' are covered with an silicon oxide film 47''' formed by means of oxidation or with an insulating film formed by means of the chemical vapor deposition, and then a wiring in the upper layer or a bonding pad 50 is connected to one or more electrode wiring path, through an opening provided in the insulating film 47''' as required (FIG. 4F). Thus, the fabrication of an NPN type bi-polar type transistor 52 is completed. The transistor 52 is isolated from other elements, e.g. transistors similar to the transistor 52 which are formed in the same substrate 41, by the PN junction between the substrate 41 and the collector region 43.

As is apparent from the foregoing description of the embodiments of the present invention, the feature of the present invention lies in that a silicon film is selectively oxidized to provide mutually isolated electrode wiring paths and then atoms of impurity are introduced through at least one of the electrode paths into that portion of the semiconductor substrated or of a region formed in the semiconductor substrate, to which the electrode wiring is connected, so that the relative positions among the P-N junction and two electrodes connected respectively to the two semiconductor regions bounded by that P-N junction are automatically determined without resorting to the so-called aligning operation.

It will be understood that the abobe description is merely illustrative of preferred embodiments of the invention. Additional modifications and improvements can be readily anticipated by those skilled in the art from the present disclosure, and such modifications and improvements may fairly be presumed to be within the scope and purview of the invention as defined by the claims that follow.

I claim:

1. A semiconductor device comprising:
   a semiconductor substrate having a first semiconductor region of one conductivity type and a second semiconductor region of the opposite conductivity type contained in said first semiconductor region with a p-n junction between said first and second semiconductor regions;
   an insulating film on one main surface of said substrate and having an opening which exposes portions of the surface of said first semiconductor region and of the surface of said second semiconductor region;
   a silicon thin film having a first segment covering said insulating film and a second segment in direct contact with the exposed surfaces of said first and second semiconductor regions, and a silicon oxide film produced by the selective oxidation of a portion of said silicon thin film and covering a portion of said p-n junction exposed in said opening of said insulating film;
   portions of said first and second segments of said silicon thin film that are not selectively oxidized defining first and second electrode wiring paths which are mutually separated by said silicon oxide film, said first and second electrode wiring paths making ohmic contacts with said first and second semiconductor regions, respectively.

2. The semiconductor device of claim 1, in which said silicon thin film is comprised of polycrystalline silicon and said first and second electrode wiring paths are doped with impurities of said one and said opposite conductivity types, respectively.

3. The semiconductor device of claim 1, further comprising an insulating layer covering the surface of said first and second electrode wiring paths.

4. The semiconductor device of claim 2, further comprising an electrical connection to at least one of said first and second electrode wiring paths through said insulating layer.

5. A semiconductor device comprising a semiconductor substrate of one conductivity type having a first region of the opposite conductivity type therein with a p-n junction between said substrate and said first region, an insulating film on the surface of said substrate and having an opening which exposes a portion of the surface of said first region as well as a portion of the surface of said substrate, a silicon thin film in direct contact with the exposed surface of said first region and extending onto said insulating film, and a silicon oxide film produced by the selective oxidation of said silicon thin film and covering a portion of said p-n junction exposed in said opening of said insulating film and also covering a portion of said insulating film, a portion of said silicon thin film that is not selectively oxidized being patterned and surrounded by said silicon oxide film and making ohmic contact with said first region.

6. A semiconductor device comprising a semiconductor substrate having a first semiconductor region of one conductivity type and a second region of the opposite conductivity type with a p-n junction between said first and second semiconductor regions; an insulating film on the surface of said substrate and having an opening which exposes a portion of said first region, a portion of said second region and a portion of said p-n junction; a silicon oxide film produced by the selective oxidation of a silicon thin film and being in direct contact with the exposed portion of said p-n junction and with portions of the exposed areas of said first and second regions in said opening of said insulating film and on said insulating film; and first and second silicon thin film members left by the selective oxidation of said silicon thin film and mutually separated by said silicon oxide film, said first and second silicon thin film members making ohmic contacts with said first and second regions in said opening, respectively and extending onto said insulating film.

7. A semiconductor device comprising a semiconductor substrate of one conductivity type, a first region of an opposite conductivity type formed in said substrate, a second region of said one conductivity type formed in said first region and defining a first p-n junction with said first region, a third region of said opposite conductivity type formed in said second region and defining a second p-n junction with said second region, said first and second p-n junctions extending to the surface of said substrate, an insulating film on said surface of said substrate; an insulating film on said surface of said substrate and having an opening which exposes a portion of said first region as well as a portion of said second region and said third region; a silicon oxide film produced by the selective oxidation of a silicon film, said silicon oxide film being in direct contact with said first and second p-n junctions at said surface of said substrate and with portions of the exposed areas of said first, second, and third regions in said opening of said insulating film, and first, second, and third silicon thin film members not oxidized during the selective oxidation of said silicon thin film and mutually separated by said silicon oxide film, said first, second, and third silicon thin film members respectively making ohmic contact with said first, second, and third regions in said opening.

8. The semiconductor device of claim 7, further comprising a fourth region of said opposite conductivity type formed in said first region and having a higher impurity concentration than said first region and underlying said first silicon thin film.

9. The semiconductor device of claim 8, in which said third and fourth regions are formed by the simultaneous introduction of impurities of said opposite conductivity type through said first and third silicon thin films, respectively.

* * * * *